(12) United States Patent
White et al.

(10) Patent No.: US 6,963,242 B2
(45) Date of Patent: Nov. 8, 2005

(54) PREDISTORTER FOR PHASE MODULATED SIGNALS WITH LOW PEAK TO AVERAGE RATIOS

(75) Inventors: Paul E. White, York, PA (US); Breck W. Lovinggood, Garland, TX (US)

(73) Assignee: Andrew Corporation, Orland Park, IL (US)

(*) Notice: Subject to any disclaimer, the term of this patent is extended or adjusted under 35 U.S.C. 154(b) by 0 days.

(21) Appl. No.: 10/631,547

(22) Filed: Jul. 31, 2003

(65) Prior Publication Data
US 2005/0024138 A1 Feb. 3, 2005

(51) Int. Cl.[7] .................................................. H03F 1/26
(52) U.S. Cl. .................... 330/149; 327/306; 375/297; 375/296; 455/341; 455/239.1; 455/63
(58) Field of Search .................... 455/341, 239.1, 455/63; 375/297, 296; 330/149; 327/306

(56) References Cited

U.S. PATENT DOCUMENTS

| | | | |
|---|---|---|---|
| 3,241,078 A | 3/1966 | Jones | 329/50 |
| 3,689,752 A | 9/1972 | Gilbert | 235/194 |
| 4,156,283 A | 5/1979 | Gilbert | 364/841 |
| 4,870,371 A | 9/1989 | Gottwald et al. | 330/149 |
| 4,879,519 A | 11/1989 | Myer | 330/149 |
| 4,978,873 A | 12/1990 | Shoemaker | 307/498 |
| 5,023,565 A | 6/1991 | Lieu | 330/151 |
| 5,049,832 A | 9/1991 | Cavers | 330/149 |
| 5,115,409 A | 5/1992 | Stepp | 364/841 |
| 5,116,040 A | 5/1992 | Sauer | 330/149 |
| 5,130,663 A | 7/1992 | Tattersall, Jr. | 330/52 |
| 5,323,119 A | 6/1994 | Powell et al. | 330/151 |
| 5,325,095 A | 6/1994 | Vadnais et al. | 342/22 |
| 5,414,383 A | 5/1995 | Cusdin et al. | 329/304 |
| 5,477,187 A | 12/1995 | Kobayashi et al. | 330/52 |

(Continued)

FOREIGN PATENT DOCUMENTS

| | | | | |
|---|---|---|---|---|
| EP | 0 085 600 A1 | 1/1983 | | H03F/1/32 |
| EP | 0 367 457 B1 | 3/1996 | | H03F/1/32 |
| EP | 0 998 026 A1 | 5/2000 | | H03F/1/32 |
| EP | 0 948 131 B1 | 3/2002 | | H03F/1/32 |
| GB | 2 347 031 A | 2/1999 | | H03F/1/32 |
| GB | 2352570 A | * | 1/2001 | |
| WO | WO 97/08822 | 3/1997 | | H03F/1/32 |

OTHER PUBLICATIONS

Vella–Coleiro, George, *Frequency–Dependent Phase Pre-Distortion for Reducing Spurious Emissions in Communication Networks*, U.S. Appl. Ser. No. 10/068,343, filed on Feb. 5, 2002.

White, Paul E. et al., *Digital Baseband Receiver in a Multi–carrier Power Amplifier*, U.S. Appl. No. 10/091,756, filed on Mar. 6, 2002.

(Continued)

Primary Examiner—Michael B. Shingleton
(74) Attorney, Agent, or Firm—Wood, Herron & Evans, L.L.P.

(57) ABSTRACT

An amplifier system containing a polynomial predistorer and a polynominal predistorter configured for use with an RF power amplifier, the polynomial predistorter having a polynomial generator configured to receive an RF input signal and generate a predistortion function based thereon, and a combiner circuit also configured to receive the RF input signal and coupled to the polynomial generator and configured to combine the RF input signal with the predistortion function to form a predistorted input signal, the predistorted input signal operable to improve the adjacent channel power and/or the error vector magnitude performance of the RF power amplifier.

50 Claims, 3 Drawing Sheets

U.S. PATENT DOCUMENTS

| | | | |
|---|---|---|---|
| 5,485,120 A | 1/1996 | Anvari | 330/151 |
| 5,491,454 A | 2/1996 | Matz | 330/149 |
| 5,528,196 A | 6/1996 | Baskin et al. | 330/151 |
| 5,594,385 A | 1/1997 | Anvari | 330/149 |
| 5,610,554 A | 3/1997 | Anvari | 330/52 |
| 5,617,061 A | 4/1997 | Fukuchi | 330/151 |
| 5,621,354 A | 4/1997 | Mitzlaff | 330/52 |
| 5,691,668 A | 11/1997 | Yoshikawa et al. | 330/151 |
| 5,732,333 A | 3/1998 | Cox et al. | 455/126 |
| 5,760,646 A | 6/1998 | Belcher et al. | 330/149 |
| 5,808,512 A | 9/1998 | Bainvoll et al. | 330/151 |
| 5,831,478 A | 11/1998 | Long | 330/52 |
| 5,862,459 A | 1/1999 | Charas | 455/114 |
| 5,867,065 A | 2/1999 | Leyendecker | 330/149 |
| 5,877,653 A | 3/1999 | Kim et al. | 330/149 |
| 5,892,397 A | 4/1999 | Belcher et al. | 330/149 |
| 5,900,778 A | 5/1999 | Stonick et al. | 330/149 |
| 5,912,586 A | 6/1999 | Mitzlaff | 330/149 |
| 5,923,214 A | 7/1999 | Mitzlaff | 330/52 |
| 5,929,703 A | 7/1999 | Sehier et al. | 330/149 |
| 5,933,766 A | 8/1999 | Dent | 445/103 |
| 5,959,499 A | 9/1999 | Khan et al. | 330/149 |
| 5,986,499 A | 11/1999 | Myer | 330/52 |
| 6,046,635 A | 4/2000 | Gentzler | 330/149 |
| 6,052,023 A | 4/2000 | Myer | 330/2 |
| 6,072,364 A | 6/2000 | Jeckeln et al. | 330/149 |
| 6,075,411 A | 6/2000 | Briffa et al. | 330/149 |
| 6,091,295 A | 7/2000 | Zhang | 330/149 |
| 6,091,715 A | 7/2000 | Vucetic et al. | 370/277 |
| 6,104,239 A | 8/2000 | Jenkins | 330/2 |
| 6,104,986 A * | 8/2000 | Arevalo | 702/120 |
| 6,118,335 A | 9/2000 | Nielsen et al. | 330/2 |
| 6,125,266 A | 9/2000 | Matero et al. | 445/126 |
| 6,137,335 A | 10/2000 | Proebsting | 327/281 |
| 6,141,390 A | 10/2000 | Cova | 375/297 |
| 6,144,255 A | 11/2000 | Patel et al. | 330/151 |
| 6,148,185 A | 11/2000 | Maruyama et al. | 455/115 |
| 6,154,641 A | 11/2000 | Zhang | 455/112 |
| 6,157,253 A | 12/2000 | Sigmon et al. | 330/10 |
| 6,208,846 B1 | 3/2001 | Chen et al. | 455/127 |
| 6,211,733 B1 | 4/2001 | Gentzler | 330/149 |
| 6,236,267 B1 | 5/2001 | Anzil | 330/149 |
| 6,236,837 B1 | 5/2001 | Midya | 455/63 |
| 6,275,685 B1 | 8/2001 | Wessel et al. | 455/126 |
| 6,285,251 B1 | 9/2001 | Dent et al. | 330/127 |
| 6,285,255 B1 | 9/2001 | Luu et al. | 330/149 |
| 6,304,140 B1 | 10/2001 | Thron et al. | 330/149 |
| 6,337,599 B2 | 1/2002 | Lee | 330/149 |
| 6,342,810 B1 | 1/2002 | Wright et al. | 330/51 |
| 6,353,360 B1 | 3/2002 | Hau et al. | 330/149 |
| 6,356,146 B1 | 3/2002 | Wright et al. | 330/2 |
| 6,359,508 B1 | 3/2002 | Mucenieks | 330/149 |
| 6,377,785 B1 | 4/2002 | Ogino | 455/127 |
| 6,414,545 B1 | 7/2002 | Zhang | 330/149 |
| 6,512,417 B2 | 1/2003 | Booth et al. | 330/149 |
| 6,750,710 B2 * | 6/2004 | Ring | 330/149 |

OTHER PUBLICATIONS

DeBruyn, William P. et al., *An Uncorrelated Adaptive Predistorter*, U.S. Appl. No 10/342,633, filed on Jan. 15, 2003.

Leffel, Michael D., *Independence Between Paths That Predistort for Memory and Memory–less Distortion in Power Amplifiers*, U.S. Appl. No. 10/406,959, filed on Apr. 3, 2003

Bachman, II, Thomas A. et al., *Elimination of Peak Clipping and Improved Efficiency for RF Power Amplifiers With a Predistorter*, U.S. Appl. No. 10/625,761, filed on Jul. 23, 2003.

*British Patent Office Search Report*, for British Patent Application No. 0415460.5 dated Nov. 16, 2004, (1 page).

Lohtia, Anit et al., "Power Amplifier Linearization using Cubic Spline Interpolation", *IEEE*, (1993), No. 0–7803–1266–x/93, pp. 676–679.

Stapleton, Shawn P., "Amplifier Linearization Using Adaptive Digital Predistortion –The need for greater linearity can be addressed at the digital coding level", *Applied Microwave & Wireless*, Technical Feature, (Feb. 2001), pp. 72–77.

* cited by examiner

PREDISTORTER FOR PHASE MODULATED SIGNALS WITH LOW PEAK TO AVERAGE RATIOS

FIELD OF THE INVENTION

This invention generally relates to predistortion techniques used with RF power amplifiers, and more particularly to a predistorter for phase modulated signals with low peak to average ratios.

BACKGROUND OF THE INVENTION

Predistortion techniques have been used with both single carrier and multi-carrier radio frequency (RF) power amplifiers to correct for distortion resulting from amplitude-to-amplitude (AM-AM) and amplitude-to-phase (AM-PM) non-linearities in such amplifiers. Typically, non-linearities result in intermodulation distortion (IMD) products and/or adjacent channel power (ACP). Thus, ACP is one parameter that may be used to judge the effectiveness of a predistortion technique, the reduction in ACP being attributable to a predistorter.

However, predistorters are not useful in all communications systems. For example, RF power amplifiers used in Global System for Mobile Communication (GSM) and/or Enhanced Data Rates for Global Evolution (EDGE) systems have not benefited from predistorters primarily due to two reasons. First, stringent IMD requirements for GSM and EDGE systems often force the use of single carrier RF power amplifiers. Second, GSM and EDGE waveforms typically have low peak to average power ratios, benefiting more so from higher efficiency single carrier power amplifiers than other modulation schemes, such as Code Division Multiple Access (CDMA), Universal Mobile Telephone System (UMTS), etc. Thus, the low peak to average power ratio of EDGE and GSM waveforms, as well as other systems using phase modulation allow the use of RF power amplifiers operating close to the saturated power output rating of the amplifiers without significant degradation in ACP performance.

Another parameter that may be used to judge the effectiveness of a predistorter when used with a RF power amplifier is referred to as Error Vector Magnitude (EVM). EVM is a measurement of the amount of error remaining in a signal due to magnitude and phase distortion. In RF power amplifiers, the distortion effects due to changes in phase, i.e., AM-PM, begin at lower power levels than distortion effects due to changes in amplitude, i.e., AM-AM. Therefore, even though ACP requirements may be satisfied, in order to reduce the EVM, the RF power amplifier need be operated at reduced power levels. Such reduced power levels reduce the efficiency of the RF power amplifier, while simultaneously increasing system costs.

Since EDGE and/or GSM systems often use separate power amplifiers for each RF channel, there is a desire to keep cost of these amplifiers low, and their efficiency high. Thus, the cost and efficiency for these single carrier amplifiers has prevented the use of predistorters since it is often cheaper to add more output power capability to the single channel RF power amplifiers than to implement predistorters.

There is a need for a low cost adaptation of a polynomial predistorter for linearizing the phase response of a single channel RF power amplifier, and that allows operation of the amplifier at power levels close to saturation.

BRIEF DESCRIPTION OF THE DRAWINGS

The accompanying drawings, which are incorporated in and constitute a part of this specification, illustrate embodiments of the invention and, together with the detailed description of the embodiments given below, serve to explain the principles of the invention.

DETAILED DESCRIPTION OF THE DRAWINGS

Figure 1:
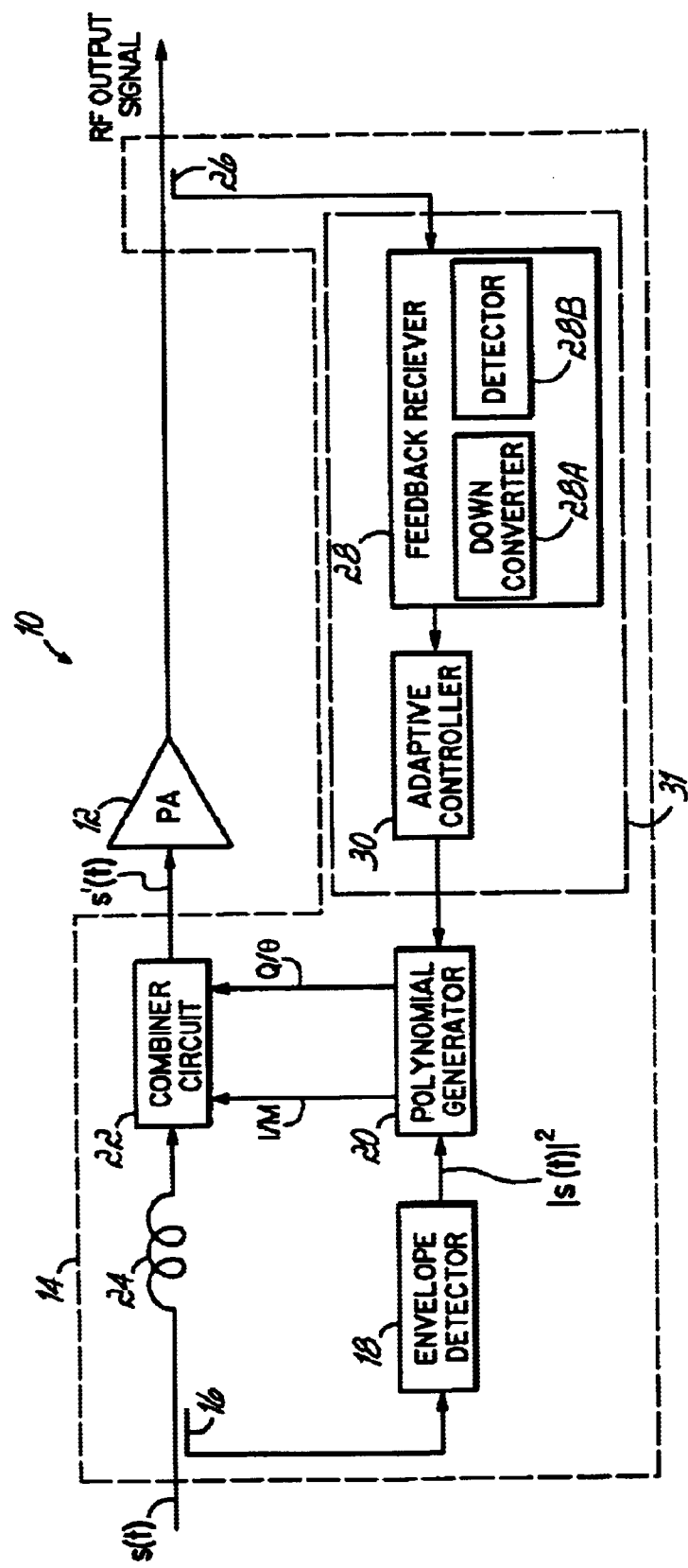
FIG. 1 is a high-level block diagram of a polynomial predistorter consistent with principles of the present invention.
Figure 2:
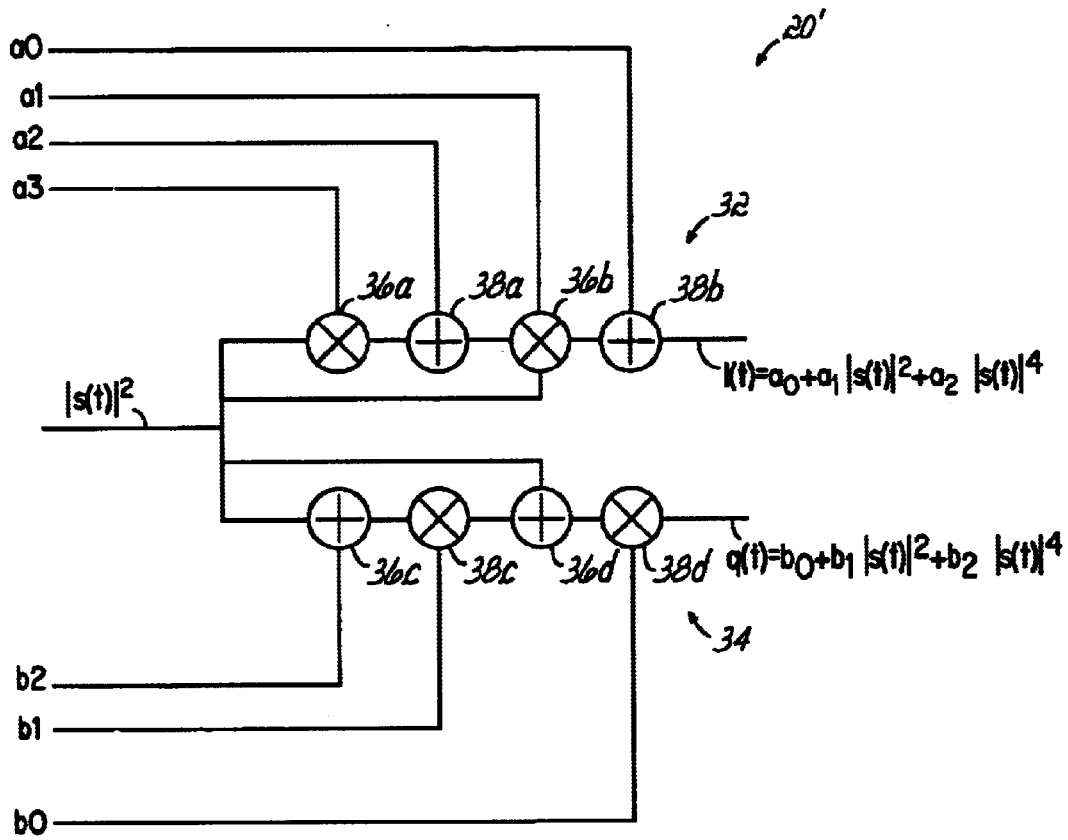
FIG. 2 is a schematic diagram of an I/Q polynomial generator using analog multipliers as an exemplary implementation of the polynomial generator of FIG. 1.
Figure 3:
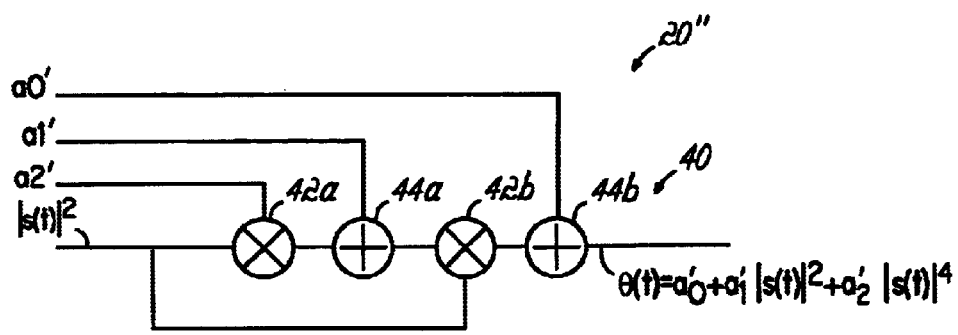
FIG. 3 is a schematic diagram of a multiplier implementation for a phase predistortion polynomial generator as an exemplary implementation of the polynomial generator of FIG. 1.

With reference to FIGS. 1–3, wherein like numerals denote like parts, there is shown an RF power amplifier and a polynomial predistorter configured for use therewith. The polynomial predistorter reduces the effects of non-linearities in the response of the radio frequency (RF) power amplifier, thereby allowing an increase in efficiency, with reduced complexity and cost. Further, a polynomial generator within the polynomial predistorter may be specifically tailored to improve the error vector magnitude (EVM) performance of the RF power amplifier by solely predistorting the phase of an input signal.

Referring first to FIG. 1, a high-level block diagram of an embodiment 10 of an amplifier system comprising an RF power amplifier 12 and polynomial predistorter 14 for use therewith is shown. Amplifier system 10 may be configured for use in practically any desired frequency band using practically any known or yet unknown phase modulation schemes having low peak to average power ratios, such as in Global System for Mobile Communication (GSM) and/or Enhanced Data Rates for Global Evolution (EDGE) systems.

RF power amplifier 12 is typical of RF power amplifiers known to those of skill in the art having linear, compression, and saturation regions of operation. Moreover, RF power amplifier 12 may suffer from amplitude and/or phase non-linearities. RF power amplifier 12 may also be a class A or class AB single channel amplifier.

Polynomial predistorter 14 comprises first coupler 16, envelope detection circuit 18, polynomial generator 20, and combiner circuit 22. As configured in FIG. 1, first coupler 16 accepts an RF input signal s(t), coupling the signal to envelope detection circuit 18 and complex multiplier 22.

RF input signal s(t) may be a communications signal of the type having a low peak power to average power ratio. Moreover, RF input signal s(t) may be a phase modulated signal. Such phase modulated low peak power to average power ratio signals may be found in GSM and/or EDGE systems, as well as other known and yet unknown systems having similar modulation characteristics.

Envelope detection circuit 18 generates the squared magnitude of the RF input signal s(t), and is indicated at $|s(t)|^2$. In some embodiments of the present invention, envelope detection circuit 18 may comprise a diode. The squared magnitude of the RF input signal $|s(t)|^2$ is coupled to polynomial generator 20, and used to generate a predistortion function. Those skilled in the art will appreciate that other signals representative of either the magnitude or the power of the RF input signal may be used as an alternative to the squared magnitude of the RF input signal $|s(t)|^2$ in generating a predistortion function without departing from the spirit of the present invention.

The predistortion function may be a complex signal that is in either in-phase/quadrature phase, i.e., I/Q, or magnitude/phase, i.e., M/θ, form, and are indicated at I/M and Q/θ, respectively. Additional description of embodiments of polynomial generator 20 may be found herein below in conjunction with the description of FIGS. 2 and 3.

Figure 4A:
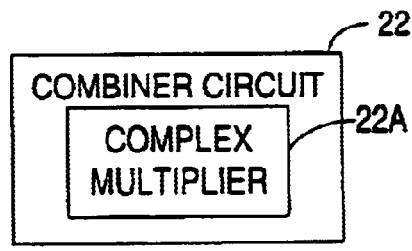
FIGS. 4A, 4B and 4C are exemplary implementations of the combiner circuit of FIG. 1.

The predistortion function generated by polynomial generator 20 is coupled to combiner circuit 22. Combiner circuit 22 combines the RF input signal s(t) with the predistortion function I/M, Q/θ to form a predistorted input signal s'(t). For example, as shown in FIG. 4A, combiner circuit 22 may comprise a complex multiplier 22A and multiply the RF input signal s(t) by the predistortion function I/M, Q/θ. The product of the RF input signal s(t) and the predistortion function I/M, Q/θ, being indicated at s'(t). The predistorted input signal s'(t) is then coupled to RE power amplifier 12. Such a predistorted input signal s'(t) improves the linearity of the response of RF power amplifier 10, thereby improving the adjacent channel power (ACP) and/or error vector magnitude (EVM) performance.

In some embodiments of the present invention, polynomial predistorter 14 may further comprise a delay circuit or delay line coupled intermediate first coupler 16 and combiner circuit 22. For example, and as shown in FIG. 1, delay circuit 24 allows enough time for detection and conversion such that the RF input signal s(t) is coupled to combiner circuit 22 at the same time as the predistortion values I/M, Q/θ.

It has been found that the effectiveness of a polynomial predistorter when used with a RF power amplifier may vary with operating conditions such as temperature, frequency, time, etc. Moreover, in multi-carrier applications or applications that require operation over a broad range of conditions, it may be necessary to adapt the characteristics of the polynomial generator in order to achieve suitable ACP and/or EVM performance.

To this end, and in order to adapt polynomial generator 20, polynomial predistorter 14 may further comprise second coupler 26 and adaptor circuit 31. More specifically, adaptor circuit 31 may comprise feedback receiver 28 and adaptive controller 30. Thus, as configured in FIG. 1, for example, the output of RF power amplifier 12 is fed through second coupler 26. Second coupler 26 couples a portion of the output signal to feedback receiver 28. Feedback receiver 28 may comprise a down converter 28A and a detector 28B that is used to measure ACP. Feedback receiver 28 couples the ACP to adaptive controller 30. Adaptive controller 30, coupled to polynomial generator 20, modifies the generation of predistortion values I/M, Q/θ in polynomial generator 20 to provided improved ACP performance over varying and/or broad operating conditions.

In another embodiment of the present invention, second coupler 26, feedback receiver 28, and adaptive controller 30 may be eliminated, and polynomial generator 20 may be predictively adjusted based on the current operating conditions. In this embodiment, it is necessary to characterize the power amplifier and predistorter over a range of operating conditions.

Referring now to FIG. 2, a schematic diagram of an I/Q polynomial generator 20', as an exemplary implementation of polynomial generator 20 of FIG. 1, is shown. Polynomial generator 20' includes first and second multiplier chains, as indicated at reference numerals 32 and 34, respectively, each comprising a coupled series of analog multipliers 36a–d and summers 38a–d with inputs a0–a3, b0–b3 that determine the coefficients of polynomials i(t), q(t). As configured, first chain 32 generates in-phase predistortion function i(t), where $i(t)=a_0+a_1|s(t)|^2+a_2|s(t)|^4$, while second chain 34 generates quadrature-phase predistortion function q(t), where $q(t)=b_0+b_1|s(t)|^2+b_2|s(t)|^4$.

Those skilled in the art will appreciate that polynomial generator 20' is but one-way of implementing a polynomial generator using analog multipliers. Those skilled in the will also appreciate that there may be other ways of implementing a polynominal generator. Further, those skilled in the art will appreciate that embodiments of the present invention are not limited to the polynomial generators and polynomials described herein, but rather include any practical polynomial generators capable of producing any polynomials desired.

Figure 4B:
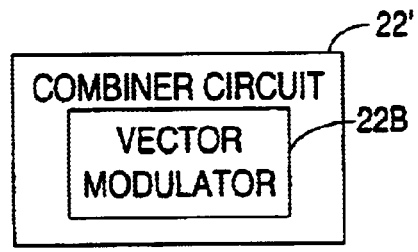
Figure 4C:
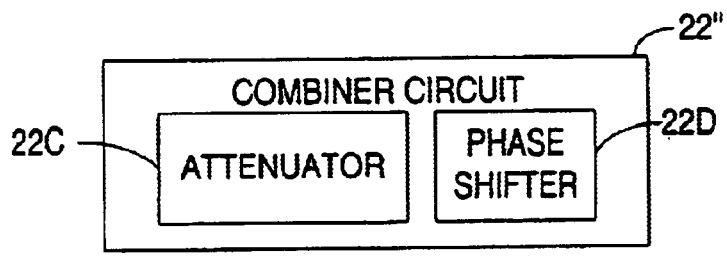

Alternatively, one or more multiplier chains may be used to generate the magnitude and/or phase predistortion functions. Since the predistortion function is a complex function, it is necessary for the combiner circuit to also be complex. Thus, as will be appreciated by those skilled in the art, a combiner circuit, such as combiner circuit 22 shown in FIG. 1, may advantageously comprise a vector modulator when an I/Q predistortion function is used (e.g., as illustrated in FIG. 4B where a combiner circuit 22' includes a vector modulator 22B) or an attenuator and a phase shifter when a magnitude/phase predistortion function is used (e.g., as illustrated in FIG. 4C where a combiner circuit 22" includes an attenuator 22C and a phase shifter 22D).

While ACP may be used to evaluate the effectiveness of a predistorter and to adapt a polynomial generator as described hereinabove, the present invention may be specifically tailored to improve the EVM performance of an RF power amplifier when used in a phase modulated systems having low peak power to average power ratios, such as EDGE and GSM systems. To this end, it has been discovered that amplitude-to-phase (AM-PM) non-linearities in such amplifiers occur at lower power levels than amplitude-to-amplitude (AM-AM) non-linearities, and well before such amplifiers reach compression. Moreover, such phase distortion, or AM-PM, is a major contributor to the EVM performance of RF power amplifiers. Thus, embodiments of the present invention may solely predistort the phase of an input signal as it is applied to an RF power amplifier to improve EVM performance.

Referring now to FIG. 3, a schematic diagram of a phase predistortion polynomial generator 20", as an exemplary implementation of polynomial generator 20 of FIG. 1, is shown. Polynomial generator 20" includes a single multiplier chain, as indicated at reference numeral 40, and comprises a coupled series of analog multipliers 42a, 42b and summers 44a, 44b with inputs a0'–a3' that determine the coefficients of polynomial θ(t). As configured, chain 40 generates phase predistortion function θ(t), where $\theta(t)=a_0'+a_1'|s(t)|^2+a_2'|s(t)|^4$.

Those skilled in the art will note that the component count and complexity between polynomial generator 20" shown in FIG. 3 has been cut in half, or reduced by fifty-percent, as compared to polynomial generator 20' shown in FIG. 2. In addition, and as also shown in FIG. 1, combiner circuit 22 may be reduced to a simple phase shifter. This simplification of a polynomial generator 20" and a combiner circuit 22 reduces the cost of amplifier system 10 and polynomial generator 14 used therein, and may be directly applied to EDGE and GSM systems, as well as yet unknown modulation schemes with phase modulation and low peak to average ratios. Moreover, and as will be appreciated by those skilled in the art, such a simplification of a polynomial generator and combiner circuit is possible for practically all realizations of a predistorter including digitally based look-up tables, neural networks, and analog multipliers.

Thus, particular embodiments of the present invention may provide an improvement in EVM performance for EDGE/GSM waveforms. This improvement in EVM performance for a given set of RF power amplifiers translates into notable benefits to the user. First, since the EVM performance of a given set of RF power amplifiers is improved, those amplifiers may be operated at output levels closer to their saturated power rating. This may allow a RF power amplifier manufacturer to select lower power rated device for use therein, while still meeting a given output power specification. Such use of lower power rated devices may result in lower cost to a customer.

Second, because the EVM performance may have been improved and the power devices are being operating closer to saturated power output, the efficiency of the RF power amplifier consequently improves. For communications systems that use multiple single carrier power amplifiers efficiency is a major consideration. Thus, typical improvements in the efficiency of the RF power amplifiers reduces the amount of thermal load a communications system must be designed to handle, which may also reduce costs. Additionally, by reducing the thermal load in a system the reliability of the system is typically improved. Finally, improved efficiency means the communications system consumes less electrical power, which may also reduce operating costs.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicants' general inventive concept.

What is claimed is:

1. A polynomial predistorer configured for use with an RF power amplifier, the polynomial predistorter comprising:
   a polynomial generator configured to receive an RF input signal and generate a predistortion function based thereon, wherein the polynomial generator includes first and second multiplier chains, each multiplier chain comprising a coupled series of multipliers and summers with inputs that determine the coefficients of the predistortion function; and
   a combiner circuit coupled to the polynomial generator and configured to combine the RF input signal with the predistortion function to form a predistorted input signal;
   the predistorted input signal operable to improve at least one of the adjacent channel power and the error vector magnitude performance of the RF power amplifier.

2. The polynomial predistorter of claim 1, wherein the RF input signal is of the type having phase modulation and a low peak to average ratio.

3. The polynomial predistorter of claim 1, wherein the RF input signal is at least one of an EDGE and GSM signal.

4. The polynomial predistorter of claim 1, further comprising a first coupler coupled intermediate the RF input signal and the combiner circuit and the polynomial generator and configured to divide the RF input signal.

5. The polynomial predistorter of claim 4, further comprising an envelope detection circuit coupled intermediate the first coupler and the polynomial generator and configured to determine the magnitude of the RF input signal.

6. The polynomial predistorter of claim 4, further comprising an envelope detection circuit coupled intermediate the first coupler and the polynomial generator and configured to generate the squared magnitude of the RF input signal.

7. The polynomial predistorter of claim 4, further comprising an envelope detection circuit coupled intermediate the first coupler and the polynomial generator and configured to determine the power of the RF input signal.

8. The polynomial predistorter of claim 4, further comprising a delay circuit coupled intermediate the first coupler and the combiner circuit, the delay circuit configured to delay the application of the RF input signal to the combiner circuit.

9. The polynomial predistorter of claim 1, wherein the combiner circuit comprises a complex multiplier.

10. The polynomial predistorter of claim 1, wherein the combiner circuit comprises a vector modulator and the predistortion function is an I/Q predistortion function.

11. The polynomial predistorter of claim 1, wherein the combiner circuit comprises an attenuator and a phase shifter and the predistortion function is a magnitude/phase predistortion function.

12. The polynomial predistorter of claim 1, wherein the combiner circuit comprises an attenuator and a phase shifter and the predistortion function is a phase predistortion function.

13. The polynomial predistorter of claim 1, wherein the RF power amplifier and the polynomial generator are characterized over a range of operating conditions and the polynomial generator is predictively adjusted based on current operating conditions.

14. The polynomial predistorter of claim 1, further comprising:
   a second coupler coupled to the output of the RF power amplifier; and,
   an adaptor circuit coupled to the second coupler and configured to measure adjacent channel power and modify the generation of the predistortion function in response thereto.

15. The polynomial predistorter of claim 14, wherein the adaptor circuit comprises a feedback receiver.

16. The polynomial predistorter of claim 14, wherein the adaptor circuit comprises a down converter and a detector.

17. The polynomial predistorter of claim 14, wherein the adaptor circuit comprises an adaptive controller.

18. The polynomial predistorter of claim 1, wherein the first chain generates an in-phase predistortion function and the second chain generates a quadrature-phase predistortion function.

19. An amplifier system comprising an RF power amplifier and a polynomial predistorter, the polynomial predistorter comprising:
   a polynomial generator configured to receive an RF input signal and generate a predistortion function based thereon, wherein the polynomial generator includes a single multiplier chain, the chain comprising a coupled series of analog multipliers and summers with inputs that determine the coefficients of the predistortion function; and, a combiner circuit coupled to the polynomial generator and configured to combine the RF input signal with the predistortion function to form a predistorted input signal;

the predistorted input signal operable to improve at least one of the adjacent channel power and the error vector magnitude performance of the RF power amplifier.

20. The amplifier system of claim 19, wherein the RF input signal is of the type having phase modulation and a low peak to average ratio.

21. The amplifier system of claim 19, wherein the RF input signal is at least one of an EDGE and GSM signal.

22. The amplifier system of claim 19, further comprising a first coupler coupled intermediate the RF input signal and the combiner circuit and the polynomial generator and configured to divide the RF input signal.

23. The amplifier system of claim 22, further comprising an envelope detection circuit coupled intermediate the first coupler and the polynomial generator and configured to determine the magnitude of the RF input signal.

24. The amplifier system of claim 22, further comprising an envelope detection circuit coupled intermediate the first coupler and the polynomial generator and configured to generate the squared magnitude of the RF input signal.

25. The amplifier system of claim 22, further comprising an envelope detection circuit coupled intermediate the first coupler and the polynomial generator and configured to determine the power of the RF input signal.

26. The amplifier system of claim 22, further comprising a delay circuit coupled intermediate the first coupler and the combiner circuit, the delay circuit configure to delay the application of the RF input signal the combiner circuit.

27. The amplifier system of claim 19, wherein the combiner circuit comprises a complex multiplier.

28. The amplifier system of claim 19, wherein the combiner circuit comprises a vector modulator and the predistortion function is an I/Q predistortion function.

29. The amplifier system of claim 19, wherein the combiner circuit comprises an attenuator and a phase shifter and the predistortion function is a magnitude/phase predistortion function.

30. The amplifier system of claim 19, wherein the combiner circuit comprises an attenuator and a phase shifter and the predistortion function is a phase predistortion function.

31. The amplifier system of claim 19, wherein the RF power amplifier and the polynomial generator are characterized over a range of operating conditions and the polynomial generator is predictively adjusted based on current operating conditions.

32. The amplifier system of claim 19, further comprising:
a second coupler coupled to the output of the RF power amplifier; and
an adaptor circuit coupled to the second coupler and configured to measure adjacent channel power and modify the generation of the predistortion function in response thereto.

33. The amplifier system of claim 31, wherein the adaptor circuit comprises a feedback receiver.

34. The amplifier system of claim 31, wherein the adaptor circuit comprises a down converter and a detector.

35. The amplifier system of claim 31, wherein the adaptor circuit comprises an adaptive controller.

36. A method of predistorting an input signal applied to an RF power amplifier, the method comprising:
receiving an RF input signal;
generating a predistortion function based on the RF input signal, using a polynomial predistorter wherein the predistortion function is configured to solely predistort a phase of the RF input signal; and
combining the RF input signal with the predistortion function to improve at least one of the adjacent channel power and the error vector magnitude performance of the RF power amplifier.

37. The method of claim 36, wherein the RF input signal is of the type having phase modulation and a low peak to average ratio.

38. The method of claim 36, wherein the RF input signal is at least one of an EDGE and GSM signal.

39. The method of claim 36, further comprising dividing the RF input signal.

40. The method of claim 38, further comprising determining the magnitude of the RF input signal.

41. The method of claim 38, further comprising generating the squared magnitude of the RF input signal.

42. The method of claim 38, further comprising determining the power of the RF input signal.

43. The method of claim 38, further comprising delaying a divided portion of the RF input signal.

44. The method of claim 36, wherein the predistortion function is an I/Q predistortion function.

45. The method of claim 36, wherein the predistortion function is a magnitude/phase predistortion function.

46. The method of claim 36, wherein the predistortion function is a phase predistortion function.

47. The method of claim 36, further comprising characterizing the RF power amplifier and the predistorter over a range of operating conditions and predictively adjusting the polynomial generator based on current operating conditions.

48. The method of claim 36, further comprising coupling a portion of the RF power amplifier output, measuring adjacent channel power, and modifying the generation of the predistortion function in response thereto.

49. The method of claim 47, further comprising down converting and detecting the RF amplifier output to measure the adjacent channel, and modify the generation of the predistortion function.

50. A polynomial predistorter configured for use with an RF power amplifier, the polynomial predistorter comprising:
a polynomial generator configured to receive an RF input signal and generate a predistortion function based thereon, wherein the RF input signal is of the type having phase modulation and a low peak to average ratio, and wherein the predistortion function is configured to solely predistort a phase of the RF input signal; and,
a combiner circuit coupled to the polynomial generator and configured to combine the RF input signal with the predistortion function to form a predistorted input signal;
the predistorted input signal operable to improve the error vector magnitude performance of the RE power amplifier.

* * * * *

UNITED STATES PATENT AND TRADEMARK OFFICE
CERTIFICATE OF CORRECTION

| | | |
|---|---|---|
| PATENT NO. | : 6,963,242 B2 | |
| APPLICATION NO. | : 10/631547 | |
| DATED | : November 8, 2005 | |
| INVENTOR(S) | : Paul E. White and Breck W. Lovinggood | |

It is certified that error appears in the above-identified patent and that said Letters Patent is hereby corrected as shown below:

Title page (56)
Page 1, Column 1, References Cited, U.S. PATENT DOCUMENTS, reads "5,116,040 A 5/1992 Sauer…" and should read -- 5,119,040 A 6/1992 Long et al. … --.

Title page (56)
Page 2, Column 1, U.S. PATENT DOCUMENTS, reads "5,877,653 A 3/1999 Kim et al. …." and should read -- 5,877,653 A 3/1999 Kim … --.

Title page (56)
Page 2, Column 1, U.S. PATENT DOCUMENTS, *cite missing and should be*
-- 6,118,339 A 9/2000 Gentzler et al. 330/149 --.

Column 3, line 54, reads "… to provided improved ACP performance over varying and/or…" and should read --… to provide improved ACP performance over varying and/or… --.

Column 4, line 9, reads "…generator 20' is but one-way of implementing a polynomial…" and should read -- …generator 20' is but one way of implementing a polynomial… --.

Column 4, line 10 reads "…generator using analog multipliers. Those skilled in the will…" and should read -- …generator using analog multipliers. Those skilled in the art will… --.

Column 4, line 35 reads "…power amplifier when used in a phase modulated systems…" and should read -- …power amplifier when used in a phase modulated system… --.

Column 5, line 36 reads "…is not the intention of the applicant to restrict or in any way…" and should read -- …is not the intention of the applicants to restrict or in any way… --.

Column 5, line 40 reads "…broader aspects is not limited to the specific details repre-…" and should read -- …broader aspects is not limited to the specific details, repre-… --.

Column 5, CLAIM 1, line 46 reads, "1. A polynomial predistorer configured for use with an RF…" and should read -- 1. A polynomial predistorter configured for use with an RF… --.

UNITED STATES PATENT AND TRADEMARK OFFICE
CERTIFICATE OF CORRECTION

PATENT NO.        : 6,963,242 B2
APPLICATION NO. : 10/631547
DATED              : November 8, 2005
INVENTOR(S)       : Paul E. White and Breck W. Lovinggood It is certified that error appears in the above-identified patent and that said Letters Patent is hereby corrected as shown below:

Column 7, CLAIM 26, lines 31-35 read, "...combiner circuit, the delay circuit configure to delay the application of the RF input signal the combiner circuit." and should read -- ...combiner circuit, the delay circuit configured to delay the application of the RF input signal to the combiner circuit. --.

Column 8, CLAIM 36, lines 4-5 read, "...generating a predistortion function based on the RF input signal, using a polynomial predistorter wherein the ..." and should read -- ...generating a predistortion function based on the RF input signal using a polynomial predistorter, wherein the ... --.

Signed and Sealed this

Fourteenth Day of November, 2006

JON W. DUDAS
*Director of the United States Patent and Trademark Office*